(12) United States Patent
Wong

(10) Patent No.: US 8,884,409 B2
(45) Date of Patent: Nov. 11, 2014

(54) WAFER BACKSIDE DOPING FOR THERMAL NEUTRON SHIELDING

(75) Inventor: Stephen J. Wong, Montara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 55 days.

(21) Appl. No.: 13/559,291

(22) Filed: Jul. 26, 2012

(65) Prior Publication Data

US 2014/0027887 A1    Jan. 30, 2014

(51) Int. Cl.
*H01L 23/556* (2006.01)

(52) U.S. Cl.
USPC .................... 257/660; 257/E23.115

(58) Field of Classification Search
CPC .................................... H01L 23/556
USPC ....................... 257/630, 660, E23.115
See application file for complete search history.

(56) References Cited

U.S. PATENT DOCUMENTS

| 6,346,464 | B1 | 2/2002 | Takeda et al. |
| 6,919,647 | B2 | 7/2005 | Hackler, Sr. et al. |
| 7,901,974 | B2 * | 3/2011 | Venezia et al. ............ 257/292 |
| 8,592,957 | B2 | 11/2013 | Wakabayashi |

* cited by examiner

*Primary Examiner* — Chandra Chaudhari
(74) *Attorney, Agent, or Firm* — Rory D. Rankin; Meyertons, Hood, Kivlin, Kowert & Goetzel, P.C.

(57) ABSTRACT

A semiconductor device includes a semiconductor substrate and at least one integrated circuit formed on a frontside of the semiconductor substrate. A shielding layer is formed on a backside of the semiconductor substrate. The shielding layer includes one or more elements having a high thermal neutron absorption cross section.

8 Claims, 1 Drawing Sheet

WAFER BACKSIDE DOPING FOR THERMAL NEUTRON SHIELDING

TECHNICAL FIELD

The disclosed embodiments relate generally to semiconductor processes for forming integrated circuits on semiconductor substrates and, more specifically, to processes for forming a shielding layer on a semiconductor substrate to inhibit the effects of thermal neutrons.

BACKGROUND

Thermal neutrons are low energy neutrons that exist naturally in the environment. Thermal neutrons can penetrate materials used in buildings (e.g., concrete, steel, or glass) as well as common computer and integrated circuit related materials (e.g., copper, aluminum, plastics, solder, or mold compounds for electronics packaging). Penetration of thermal neutrons into electronics packaging may cause malfunctions and/or reduce processing speeds in integrated circuits inside the electronics packaging due to capturing of the thermal neutrons.

When a thermal neutron is captured by the nucleus of certain elements located inside the electronics packaging, a nuclear reaction might occur. The nuclear reaction may generate charged particle emission from the nucleus. The emitted charged particles may upset the voltage or amount of stored charges in an integrated circuit or other device located inside the electronics packaging. Such upset in voltage or amount of stored charges may cause malfunction in the integrated circuit.

Current approaches to reducing the effects of thermal neutron penetration include design approaches (e.g., circuit design approaches) such as providing higher charges and/or higher voltages to reduce the effect of thermal neutron generated charged particles, or logic design and architectural techniques such as the use of checksum, error correcting code, or triple modular redundancy. Such approaches, however, use additional area to the integrated circuit, increase power consumption, decrease performance, and create additional design complexity.

Another approach to reduce the effects of thermal neutron penetration includes eliminating the use of elements that have a high thermal neutron absorption cross section (i.e., a high probability that the nucleus of the element will absorb thermal neutrons) in the semiconductor manufacturing process and, thus, in the final integrated circuit/semiconductor device structure. For example, borophosphosilicate glass (BPSG) has been widely used as an interlayer dielectric and planarization material. The element boron is known to have a high thermal neutron absorption cross section. Thus, moving away from the use of BPSG towards other interlayer dielectric materials may reduce potential detrimental effects due to thermal neutron absorption.

Yet another approach is to use the $^{11}$boron isotope and eliminate the use of the $^{10}$boron isotope since a $^{11}$boron nucleus can absorb a thermal neutron and remain stable (not emit any charged particles) while the $^{10}$boron nucleus generates charged particles (e.g., a Li-7, an alpha particle, and a gamma ray photon) when absorbing a thermal neutron. However, even with the removal of BPSG and/or the switch to the $^{11}$boron isotope, many integrated circuits may still exhibit a significant level of sensitivity to thermal neutrons. Thus, since most current electronics and integrated circuit packaging materials have ineffective barriers against thermal neutron penetration, there is a need for materials and/or techniques to mitigate the penetration of thermal neutrons and the effects of thermal neutron penetration.

SUMMARY OF EMBODIMENTS

In some embodiments, a semiconductor device includes a semiconductor substrate with at least one integrated circuit formed on a frontside of the semiconductor substrate. A shielding layer is formed on a backside of the semiconductor substrate. The shielding layer includes one or more elements with a high thermal neutron absorption cross section. In some embodiments, the shielding layer is located at least about 15 microns from the at least one integrated circuit. The shielding layer may include boron (e.g., $^{10}$boron), cadmium, hafnium, indium, gadolinium, cobalt, samarium, titanium, dysprosium, erbium, europium, molybdenum, ytterbium, or combinations thereof.

In some embodiments, a semiconductor device fabrication process includes forming at least one integrated circuit on a frontside of a semiconductor substrate and forming a shielding layer on a backside of the semiconductor substrate. The shielding layer includes one or more elements with a high thermal neutron absorption cross section. In some embodiments, at least one integrated circuit is formed on the frontside of the semiconductor substrate followed by forming the shielding layer on the backside of the semiconductor substrate. In some embodiments, the shielding layer is formed on the backside of the semiconductor substrate followed by forming the at least one integrated circuit on the frontside of the semiconductor substrate. In some embodiments, the shielding layer is formed by ion implantation of the one or more elements into the backside of the semiconductor substrate. In some embodiments, the shielding layer is formed by diffusion of the one or more elements into the backside of the semiconductor substrate.

Using the shielding layer in the semiconductor device minimizes the effects of thermal neutrons on the operation of the integrated circuits in the semiconductor device. Minimizing the effects of thermal neutrons on the integrated circuits improves the reliability of the integrated circuits. Formation of the shielding layer is easily integratable into current process flows using standard processing equipment, which may reduce costs as compared to other approaches for reducing the effects of thermal neutrons.

While the embodiments are described herein by way of example and illustrative drawings, those skilled in the art will recognize that the embodiments are not limited to the examples or drawings described. It should be understood that the drawings and detailed description hereto are not intended to limit the embodiments to the particular form disclosed, but on the contrary, the embodiments are to cover all modifications, equivalents and alternatives falling within the spirit and scope of the disclosed embodiments as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must). Similarly, the words "include", "including", and "includes" mean including, but not limited to.

DETAILED DESCRIPTION

Figure 1:
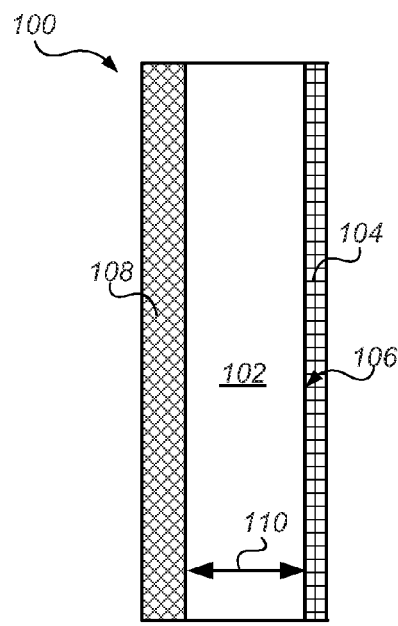
FIG. 1 depicts a cross-sectional side view of a portion of a semiconductor device, in accordance with some embodiments.

FIG. 1 depicts a cross-sectional side view of a portion of a semiconductor device, in accordance with some embodiments. Semiconductor device 100 includes substrate 102. Substrate 102 may be, for example, a silicon substrate (e.g., silicon wafer) or other semiconducting substrate. In some embodiments, substrate 102 may include other semiconducting elements (e.g., silicon carbide, silicon germanium, gallium arsenide, etc.).

In some embodiments, one or more integrated circuits 104 are formed on a frontside of device 100 (e.g., a frontside of substrate 102). The frontside of device 100 (or the frontside of substrate 102) is a side (or surface) of device 100 (or substrate 102) onto which the one or more integrated circuits 104 are formed. Integrated circuits 104 may include integrated circuits formed using standard integrated circuit processing flows. For example, integrated circuits 104 may be formed using techniques including, but not limited to, well definition, field oxide formation, source/drain formation, gate oxidation, metal deposition, interlayer dielectric deposition, bump processing, and patterning/photolithography steps. In some embodiments, integrated circuits 104 have a selected depth 106 that is sensitive to stray charges (e.g., thermal neutrons). Depth 106 may be determined, for example, by the depth of elements in integrated circuits 104 that have a high thermal neutron absorption cross section.

In some embodiments, shielding layer 108 is formed on a backside of device 100 (e.g., a backside of substrate 102). The backside of device 100 (or the backside of substrate 102) is a side (or surface) of device 100 (or substrate 102) onto which no integrated circuits are formed. In some embodiments, shielding layer 108 includes one or more elements with a high thermal neutron absorption cross section. For example, shielding layer 108 may be formed by doping one or more elements having a high thermal neutron absorption cross section into the backside of substrate 102. Examples of elements having a high thermal neutron absorption cross section that may be used to form shielding layer 108 include, but are not limited to, boron, $^{10}$boron (boron-10 isotope), cadmium, hafnium, indium, gadolinium, cobalt, samarium, titanium, dysprosium, erbium, europium, molybdenum, ytterbium, and combinations thereof.

Element having a high thermal neutron absorption cross section that are used to form shielding layer 108 may be provided (doped) into substrate 102 using standard doping techniques such as ion implantation or diffusion. In some embodiments, additional processes are used to form a desired dopant profile in shielding layer 108. For example, a drive-in process or an anneal process may be used to form a desired dopant profile in shielding layer 108. In some embodiments, the desired dopant profile is achieved by ion implantation at desired voltages and doses of the doping element. For example, boron may be implanted at 100 keV with boron doses of $10^{15}$ cm$^{-2}$ or higher to provide a desired boron dopant profile in shielding layer 108.

Figure 2:
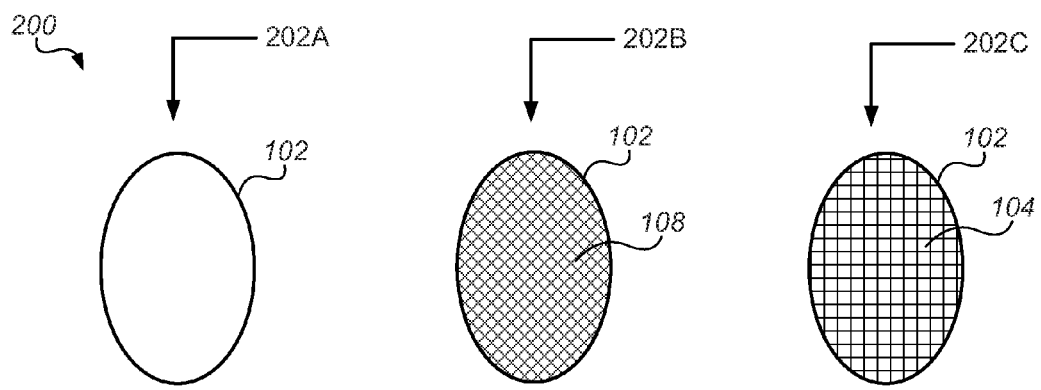
FIG. 2 depicts an embodiment of a first process flow option for forming a shielding layer, in accordance with some embodiments.

Shielding layer 108 may be formed before, during, or after formation of integrated circuits 104 on the frontside of substrate 102. FIG. 2 depicts an embodiment of a first process flow option for forming shielding layer 108, in accordance with some embodiments. As shown in FIG. 2, process flow 200 includes obtaining substrate 102 in process step 202A. Substrate 102 may be, for example, a blank semiconductor wafer. In process step 202B, shielding layer 108 is formed on the backside of substrate 102. Shielding layer 108 may be formed, for example, using ion implantation or diffusion of one or more elements having a high thermal neutron absorption cross section into substrate 102.

In process step 202C, after formation of shielding layer 108, substrate 102 may be subjected to one or more process steps to form integrated circuits 104 on the frontside of the substrate. Process step 202C may include, for example, well definition, field oxide formation, source/drain formation, gate oxidation, metal deposition, interlayer dielectric deposition, bump processing, and/or patterning/photolithography steps. In some embodiments, substrate 102 may undergo further processing (e.g., packaging or other finishing steps) to form a semiconductor device.

Figure 3:
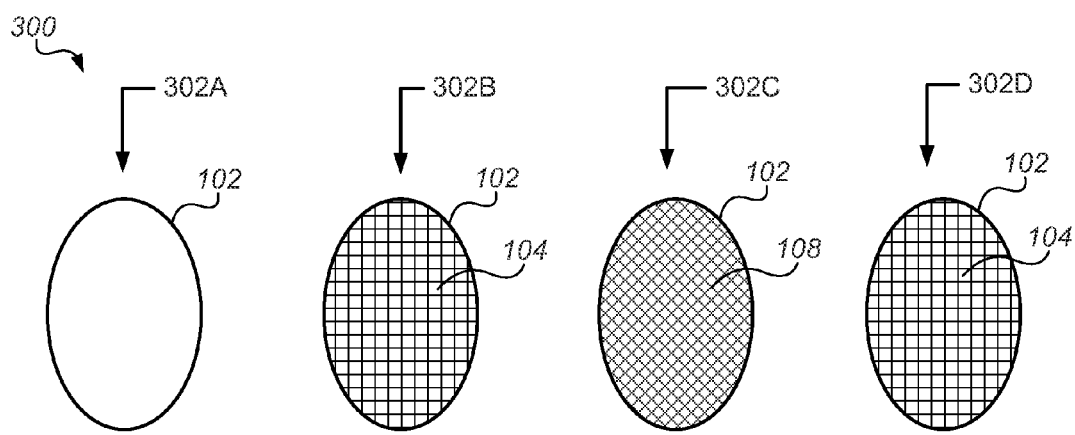
FIG. 3 depicts an embodiment of a second process flow option for forming a shielding layer, in accordance with some embodiments.

FIG. 3 depicts an embodiment of a second process flow option for forming shielding layer 108, in accordance with some embodiments. As shown in FIG. 3, process flow 300 includes obtaining substrate 102 in process step 302A. In process step 302B, substrate 102 may be subjected to one or more process steps to form integrated circuits 104 on the frontside of the substrate 102. For example, well definition, field oxide formation, source/drain formation, gate oxidation, metal deposition, interlayer dielectric deposition, and/or patterning/photolithography steps may be performed on substrate 102 to form integrated circuits 104.

In process step 302C, shielding layer 108 is formed on the backside of substrate 102. Shielding layer 108 may be formed, for example, using ion implantation or diffusion of one or more elements having a high thermal neutron absorption cross section into substrate 102. After formation of shielding layer 108, substrate 102 may undergo final processing (e.g., bump processing and/or other finishing steps) in process step 302D to finalize integrated circuits 104.

Incorporating the formation of shielding layer 108 into either process flow 200, depicted in FIG. 2, or process flow 300, depicted in FIG. 3, may be achieved using standard processing equipment (e.g., standard doping equipment). Additionally, the step of forming shielding layer 108 may be easily incorporated into existing process flows without modifying other process steps in the existing process flows.

In some embodiments, elements in shielding layer 108, as shown in FIG. 1, capture thermal neutrons and emit charged particles such as alpha particles (e.g., $^{10}$boron may capture thermal neutrons and emit alpha particles). If these charged particles interact with (e.g., are collected by) sensitive components in integrated circuits 104, the integrated circuits 104 may malfunction. Thus, in certain embodiments, shielding layer 108 is located distance 110 from integrated circuits 104. Distance 110 may be a distance that inhibits charged particles (e.g., stray charges) emitted from elements in shielding layer 108 from interacting with or being collected by sensitive components of integrated circuits 104 (e.g., the charged particles cannot reach the integrated circuits). Thus, maintaining distance 110 between shielding layer 108 and integrated circuits 104 may improve the reliability of the integrated circuits.

In some embodiments, distance 110 is greater than a distance an alpha particle (or other charged particle) can travel in substrate 102. As an example, if shielding layer 108 includes $^{10}$boron, $^{10}$boron may emit a 1.47 MeV alpha particle after thermal neutron absorption. If substrate 102 is silicon, then the alpha particle has a range of about 15 microns. Thus, in such embodiments, distance 110 is at least about 15 microns.

Typically for silicon substrates, distance 110 is much larger than 15 microns to ensure there is no interaction between charged particles emitted by elements in shielding layer 108 and integrated circuits 104. For example, distance 110 may be at least about 50 microns, at least about 100 microns, or at least about 500 microns.

In some embodiments, shielding layer 108 includes elements having a high thermal neutron absorption cross section that do not emit charged particles after thermal neutron absorption (e.g., the elements remain stable after thermal neutron absorption). In such embodiments, there would be no criteria for distance 110 between shielding layer 108 and integrated circuits 104.

In some embodiments, shielding layer 108 has doping levels of one or more elements having a high thermal neutron absorption cross section that provide a desired, high thermal neutron absorption cross section. The high thermal neutron absorption cross section may provide shielding layer 108 with a high probability of absorption with thermal neutrons. The high probability of absorption with thermal neutrons in shielding layer 108 reduces the fluence of thermal neutrons that can pass through the backside of substrate 102 and affect integrated circuits 104 on the frontside of the substrate.

In some embodiments shielding layer 108 has a thermal neutron absorption cross section that is greater than a thermal neutron scattering cross section. In some embodiments, the thermal neutron absorption cross section of shielding layer 108 is at least 100 barns. In some embodiments, the cross section for thermal neutron absorption is at least 500 barns, at least 1000 barns, or at least 5000 barns.

Using shielding layer 108 in semiconductor device 100 provides a non-design approach to limiting the effect of thermal neutrons on the operation of integrated circuits 104 in the semiconductor device 100. Shielding layer 108 increases the interaction of thermal neutrons with the elements having high thermal neutron absorption cross section in an area of semiconductor device 100 that does not include sensitive components (e.g., integrated circuits 104). Having thermal neutrons react in an area away from the sensitive components improves the reliability of the sensitive components without a need for designing around the thermal neutron absorption. Additionally, providing shielding layer 108 in semiconductor device 100 is easily integratable into current process flows using standard processing equipment, which reduces costs as compared to design approaches for minimizing the effects of thermal neutrons and/or adding hardware to shield the semiconductor device from the thermal neutrons.

Further modifications and alternative embodiments of various aspects of the disclosed embodiments will be apparent to those skilled in the art in view of this description. Accordingly, this description is to be construed as illustrative only and is for the purpose of teaching those skilled in the art the general manner of carrying out the disclosed embodiments. Elements and materials may be substituted for those illustrated and described herein, parts and processes may be reversed, and certain features of the disclosed embodiments may be utilized independently, all as would be apparent to one skilled in the art after having the benefit of this description. Changes may be made in the elements described herein without departing from the spirit and scope of the disclosed embodiments as described in the following claims.

What is claimed:

1. A semiconductor device, comprising:
    a semiconductor substrate;
    at least one integrated circuit formed on a frontside of the semiconductor substrate; and
    a shielding layer formed on an entire backside of the semiconductor substrate, wherein the shielding layer comprises one or more elements having a thermal neutron absorption cross section greater than a threshold, wherein each of the one or more elements within the entire shielding layer is available for absorbing thermal neutrons.

2. The device of claim 1, wherein the shielding layer is located a distance from the at least one integrated circuit that is greater than a distance a charged particle can travel in the substrate.

3. The device of claim 1, wherein the high thermal neutron absorption cross section is greater than a thermal neutron scattering cross section for the one or more elements.

4. The device of claim 1, wherein the high thermal neutron absorption cross section comprises a cross section of at least 100 barns.

5. The device of claim 1, wherein the shielding layer comprises $^{10}$boron isotope.

6. The device of claim 1, wherein the shielding layer comprises boron, cadmium, hafnium, indium, gadolinium, cobalt, samarium, titanium, dysprosium, erbium, europium, molybdenum, ytterbium, or combinations thereof.

7. The device of claim 1, wherein the shielding layer comprises elements that absorb thermal neutrons and do not emit charged particles while absorbing the thermal neutrons.

8. The device of claim 7, wherein the shielding layer comprises $^{11}$boron isotope.

\* \* \* \* \*